United States Patent
Bear et al.

(10) Patent No.: US 10,289,348 B2
(45) Date of Patent: May 14, 2019

(54) TAPERED VARIABLE NODE MEMORY

(71) Applicant: WESTERN DIGITAL TECHNOLOGIES, INC., Irvine, CA (US)

(72) Inventors: Jake Bear, Lakeside, CA (US); Dillip K. Dash, San Diego, CA (US); Majid Nemati Anaraki, San Diego, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 92 days.

(21) Appl. No.: 15/396,367

(22) Filed: Dec. 30, 2016

(65) Prior Publication Data

US 2018/0191375 A1     Jul. 5, 2018

(51) Int. Cl.
| | |
|---|---|
| *G06F 3/06* | (2006.01) |
| *H03M 13/00* | (2006.01) |
| *H03M 13/11* | (2006.01) |
| *G11C 29/00* | (2006.01) |

(52) U.S. Cl.
CPC ............ *G06F 3/0673* (2013.01); *G06F 3/064* (2013.01); *G06F 3/0619* (2013.01); *H03M 13/1117* (2013.01); *H03M 13/6516* (2013.01)

(58) Field of Classification Search
CPC ........... H03M 13/1105; H03M 13/3707; G06F 3/0619; G06F 3/064; G06F 3/0673; G06F 11/1076
See application file for complete search history.

(56) References Cited

U.S. PATENT DOCUMENTS

| | | | | |
|---|---|---|---|---|
| 6,529,518 | B1 * | 3/2003 | Webber ................. | H04L 12/433 370/258 |
| 8,266,493 | B1 * | 9/2012 | Abbaszadeh ...... | H03M 13/1134 375/240.24 |
| 2006/0031744 | A1 * | 2/2006 | Blankenship ........ | H03M 13/116 714/801 |
| 2007/0220395 | A1 * | 9/2007 | Nimbalker .......... | H03M 13/033 714/758 |
| 2008/0320374 | A1 * | 12/2008 | Prabhakar .......... | H03M 13/1111 714/801 |
| 2010/0251059 | A1 * | 9/2010 | Dielissen ........... | H03M 13/1114 714/752 |

* cited by examiner

*Primary Examiner* — Guy J Lamarre
(74) *Attorney, Agent, or Firm* — Morgan, Lewis & Bockius LLP

(57) ABSTRACT

The subject technology provides a decoding solution that conserves variable node memory in Low Density Parity Check decoding operations, while supporting multiple choices of code rates. A decoder includes a plurality of variable node memories, with each of the variable node memories having a predetermined memory capacity based on a position of a respective variable node associated with the variable node memory relative to a first variable node in a series of variable nodes. The code rate determines how many of the variable node memories are used, and the size of the data stored in each memory. The capacity of the memories is predetermined so that, as the code rate and number of memories utilized by the decoder increases or decreases, utilization of the memory capacity of each variable node memory is maximized.

22 Claims, 7 Drawing Sheets

TAPERED VARIABLE NODE MEMORY

TECHNICAL FIELD

The subject technology relates generally to data storage solutions that utilize Low Density Parity Check (LDPC) for error correction coding (ECC).

BACKGROUND

Data storage applications (for example, solid state drives, hard disk drives, and the like) may use LDPC to correct errors that occur when storing and reading or sending and receiving information. One design choice in planning LDPC coding systems is an amount of redundancy (ECC parity bits) used to meet the product specification. This redundancy is represented by the code rate of an LDPC code, which is equal to the extra redundancy length divided by the total number of bits stored. The general trend is that the lower the code rate is (more redundancy is added), the better the user data is protected and the better the error correcting performance is. If the code rate is chosen too high, the device may fail before the targeted Program/Erasure lifetime. On the other hand, if the code rate is chosen too low, extra storage space may be wasted. Different LDPC encoder/decoder designs are implemented for different code rates and for different chips/technologies (2× or 1×) or applications. Devices from different manufacturers may utilize different code rates, and, in that regard, code rates may span a wide range.

SUMMARY

A system and method for performing a parity check operation in a variable rate decoder is disclosed. According to some implementations, a decoder includes a plurality of variable node memories, each of the variable node memories having a predetermined memory capacity based on a position of a respective variable node associated with the variable node memory relative to a first variable node in a series of variable nodes. The decoder also includes a message buffer for storing messages used to update variable node data stored in the plurality of variable node memories based on check-variable node calculations, and a processor. The processor is operational to determine a circulant size and a number of circulants based on a code rate associated with a codeword to be decoded using the check-variable node calculations, determine a number of the variable node memories to be used in the check-variable node calculations based on and proportional to the determined number of circulants, and store, in each variable node memory of the number of the variable node memories, an amount of the variable node data based on the determined circulant size, wherein the amount of the variable node data stored in each variable node memory is inversely proportional to the determined number of circulants.

According to some implementations, a non-transitory machine implemented method comprises determining a circulant size and a number of circulants based on a code rate associated with a codeword to be decoded using check-variable node calculations, determining, from a plurality of variable node memories, a number of the variable node memories to be used in the check-variable node calculations based on and proportional to the determined number of circulants, each of the variable node memories having a predetermined memory capacity based on a position of a respective variable node associated with the variable node memory relative to a first variable node in a series of variable nodes, and storing, in each variable node memory of the number of the variable node memories, an amount of variable node data based on the determined circulant size, wherein the amount of the variable node data stored in each variable node memory is inversely proportional to the determined number of circulants.

In some implementations, a data storage system includes a means for determining a circulant size and a number of circulants based on a code rate associated with a codeword to be decoded using check-variable node calculations, a means for providing a plurality of variable node memories, with each of the variable node memories having a predetermined memory capacity based on a position of a respective variable node associated with the variable node memory relative to a first variable node in a series of variable nodes, a means for determining, from the plurality of variable node memories, a number of the variable node memories to be used in the check-variable node calculations based on and proportional to the determined number of circulants, and a means for storing, in each variable node memory of the number of the variable node memories, an amount of the variable node data based on the determined circulant size, wherein the amount of the variable node data stored in each variable node memory is inversely proportional to the determined number of circulants.

The plurality of variable node memories of the data storage system may be divided into a plurality of subsets of variable node memories, a number of the subsets that store the variable node data may be determined by the determined number of circulants, with the determined number of circulants being selected from a plurality of predetermined numbers. In this regard, a first subset of the subsets, associated with a variable node further from the first variable node than a variable node associated with a second subset of the subsets, may comprise variable node memories having a lower memory capacity than the variable node memories in the second subset.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

The subject technology provides a low-density parity check code decoder that supports different code rates, and maintains a low overall footprint of internal memory space required for processing the variable-rate codewords. In this regard, the decoder may be initially set to receive codewords encoded to one of a predetermined plurality of code rates. On receiving a codeword encoded at a selected code rate, the decoder may automatically determine a circulant size based on the selected code rate, and, determine, during one or more parity check operations, a number of confidence values (for example, log-likelihood ratios) corresponding to the received codeword. The confidence values may then be stored in a plurality of variable node memories, with each variable node memory storing an amount of data proportional to the determined circulant size. The variable node memories are tapered in size according to a predetermined pattern to reduce the overall amount of memory used to store the confidence values, saving cost and power requirements.

Figure 1:
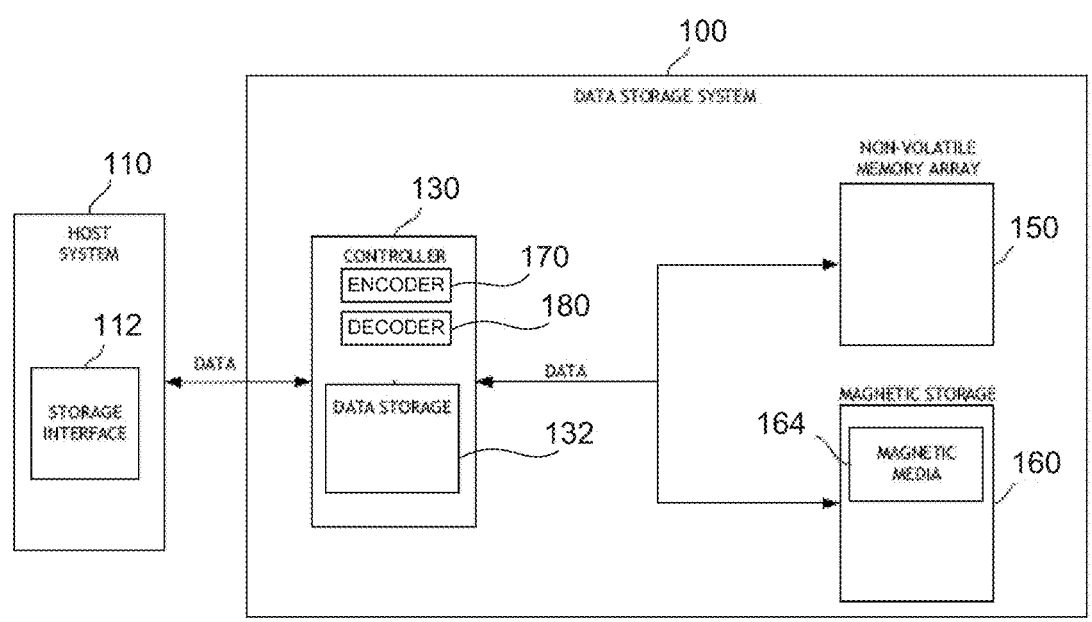
FIG. 1 illustrates an example data storage system that implements a decoder for supporting multiple code rates according to various aspects of the subject technology.

FIG. 1 illustrates an example data storage system 100 that implements a decoder supporting multiple code rates according to various aspects of the subject technology. As is shown, data storage system 100 (e.g., a solid-state drive) includes a controller 130 and a non-volatile memory array 150 and, optionally, a magnetic storage 160 which comprises magnetic media 164. The non-volatile memory array 150 may comprise non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NANDI memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. The data storage system 100 may further comprise other types of storage.

Controller 130 may be configured to receive data and/or storage access commands from a storage interface module 112 (e.g., a device driver) of a host system 110. Storage access commands communicated by the storage interface 112 may include write data and read data commands issued by the host system 110. Read and write commands may specify a logical address (e.g., logical block addresses or LBAs) used to access the data storage system 100. Controller 130 may execute the received commands in the non-volatile memory array 150.

Controller 130 includes, among other things, a data storage memory 132, an encoder 170, and a decoder 180. Controller 130 is configured to store data in and retrieve data from the non-volatile memory array 150, determine integrity of data retrieved from the non-volatile memory array, perform, if necessary, error correction of retrieved data, and perform transfer of data between the data storage system 100 and the host system 110.

Data storage system 100 may store data communicated by the host system 110. In other words, the data storage system 100 may act as memory storage for the host system 110. To facilitate this function, controller 130 may implement a logical interface. The logical interface may present to the host system 110 data storage system's memory as a set of logical addresses (e.g., contiguous address) where user data may be stored. Internally, controller 130 may map logical addresses to various physical locations or addresses in the non-volatile memory array 150 and/or other storage modules.

Figure 2:
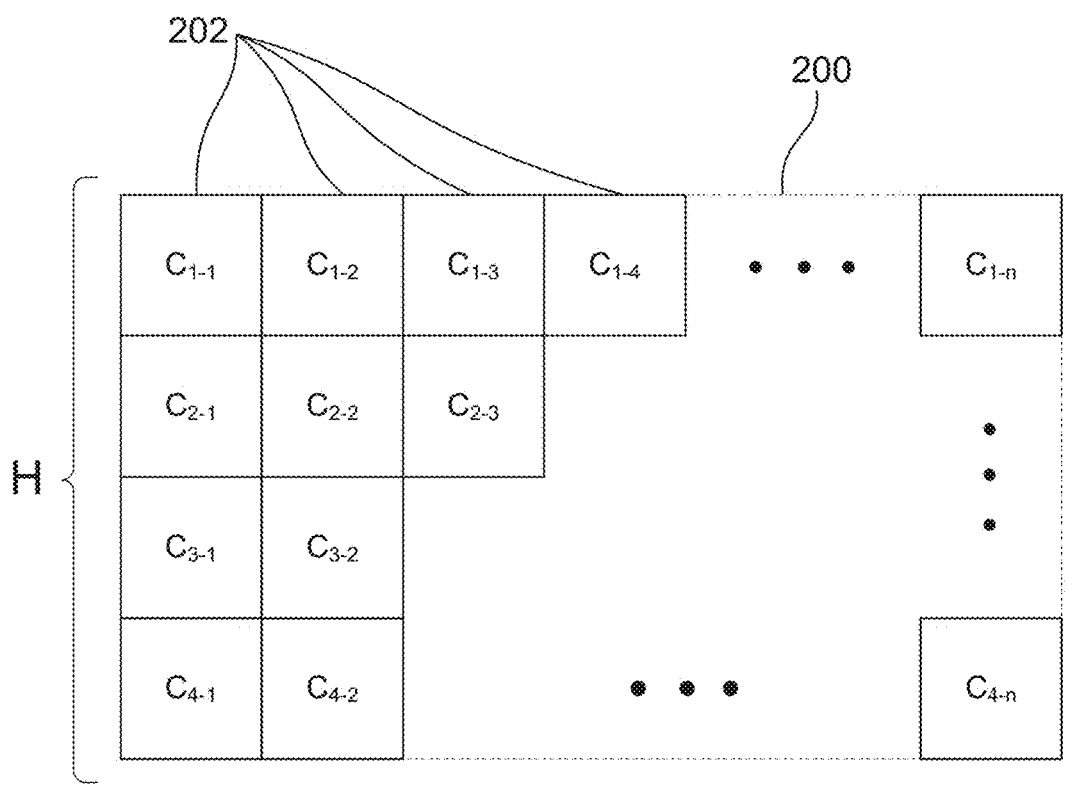
FIG. 2 depicts an exemplary parity-check matrix that may be used to decode a LDPC codeword according to various aspects of the subject technology.

FIG. 2 depicts an exemplary parity-check matrix 200 that may be used to decode a LDPC codeword according to various aspects of the subject technology. Generally, a parity-check matrix 200, also termed an "H matrix", may be generated from a corresponding G matrix (and vice versa), such that $G \cdot H^T = 0$. Each bit position of a row in the parity-check matrix may correspond to a bit position of a codeword u (not shown), such that, a product of the codeword u and a row of the matrix produces a zero result, for example, $H^i \cdot u^T = 0$ for any selected row i.

A codeword u may be generated from the product of a generator matrix G, and a user payload s (for example, a series of bits of data), such that $G \cdot s = u$. In some aspects of the subject technology, the G matrix may be constructed as $G = g_{(identity)} + g_{(x)}$, where $g_{(identity)}$ is an identity matrix and $g_{(x)}$ includes a bit pattern determined, for example, by an error correction algorithm. In this manner, a raw bit pattern of u may include a first section providing the original user payload s and a second section including error correction data generated by the product of s and G.

Parity-check matrix 200 may be constructed such that it includes many more 0 or null values than non-zero values (for example, 1's) at each row position. In one aspect according to the subject technology, parity-check matrix 101 may be constructed from a number of circulants 202. A circulant 202 may be a sub-matrix in the form of an identity matrix. In some aspects, each circulant 202 of parity-matrix 200 may be a permutation of a single p×p identity matrix, for example, by cyclically shifting the identity matrix. In other aspects, for each circulant 202, a system may store (for example, in a memory) a non-zero starting bit position (column or row) of the circulant so that the circulant may be generated by cyclically shifting the starting bit position to complete the circulant. In this regard, a memory or other storage device for storing information to generate circulants 202 may need only include a number of bits required to generate one bit position for each circulant in parity-check matrix 200. For example, to store 4 rows of 24 circulants, each circulant having a circulant size p=192, a memory size of 864 bytes may be required (9 bits×4×24).

Figure 3:
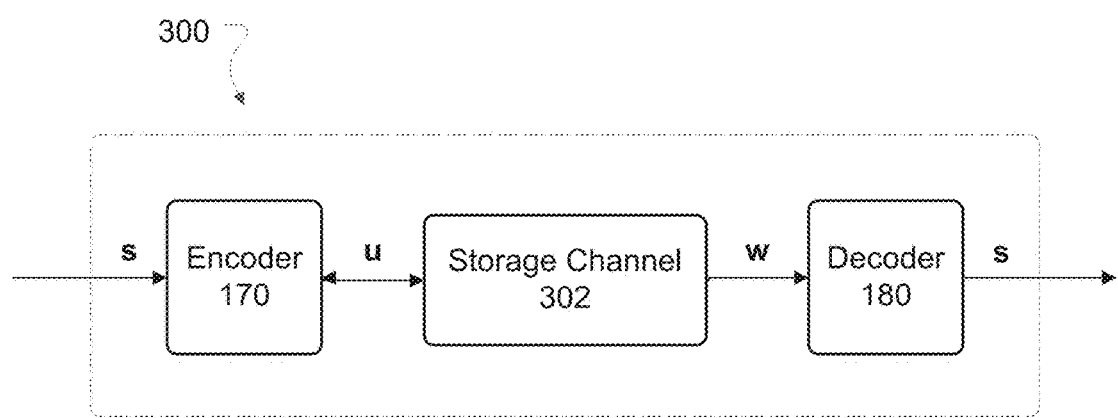
FIG. 3 depicts an exemplary system, including an encoder, a storage channel, and a decoder for the encoding, transmission and/or storage, and decoding of data, respectively, according to various aspects of the subject technology.

FIG. 3 depicts an exemplary system 300, including an encoder 170, a storage channel 302, and a decoder 180 for the encoding, transmission and/or storage, and decoding of data, respectively, according to various aspects of the subject technology. Encoder 170 may produce a codeword a by encoding a data payload s. Data payload s may include a data input A appended by error correction data. Encoder 170 may encode a user payload s using, for example, a generator matrix G. Codeword a may be transmitted to a storage channel 302 for storage, and then at a later time to decoder 180. Decoder 180 may perform data decoding operations using, for example, a parity check matrix, to reconstruct data payload s. As part of decoding operations, decoder 204 may attempt to reconstruct the original word $s=\{s_1, s_2, \ldots s_n\}$ from a received word $w=(w_1, w_2, \ldots w_n)$. Received word w may include soft values (unverified values) for $w_1, w_2, \ldots w_n$ provided from, for example, a channel detector (for example, a soft-output Viterbi detector). Once codeword u has been reconstructed, decoder 180 may include a channel decoder for removing the redundant error correction data to produce original data input A.

Figure 4:
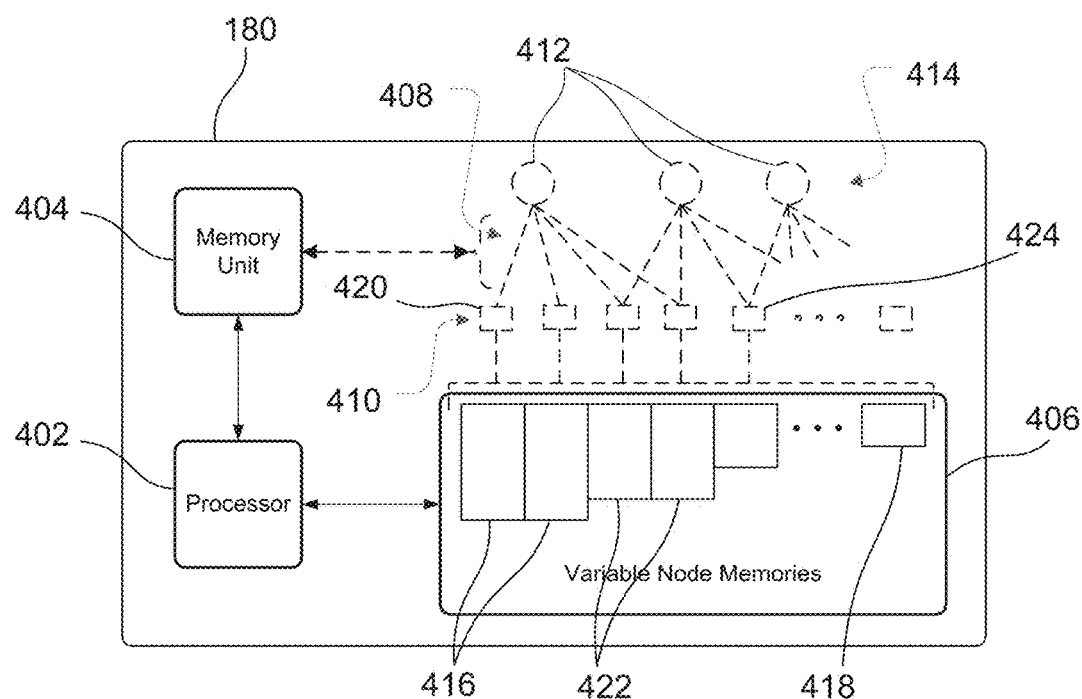
FIG. 4 depicts an example decoder for decoding bits of a codeword, according to various aspects of the subject technology.

FIG. 4 depicts an example decoder 180 for decoding bits of a codeword, according to various aspects of the subject technology. Decoder 180 (e.g., implemented as a LDPC decoder) may include a processor 402, one or more memory units 404 (e.g., memory banks, flash memory chips, or the like), and a plurality of variable node memories 406. In some implementations, processor 402 and/or memory unit 404 may be part of controller 130 (e.g., memory unit 404 may be interchangeable with data storage memory 132).

Decoder 180 may use a parity-check matrix to generate and/or update stored confidence values during a decoding of the received codeword. Not all bit values of a received codeword may be decoded simultaneously but, rather, the bit values may be decoded based on a parity check equation generated from a processed row of the parity-check matrix. Messages 408 are passed between variable nodes 410 and check nodes 412 (aka "constraint nodes") according to a code graph 414. Memory unit 404 may function as a message buffer for storing one or more messages 408 used to update variable node data stored in variable node memories 406 based on one or more check-variable node calculations.

Each variable node 410 may be assigned to a respective bit of a codeword u to be decoded by decoder 180. In this regard, a confidence value is assigned to a bit to provide an indication as to whether the bit is correct. In some implementations, each variable node 410 may be assigned to more than one bit of a codeword, or to a codeword symbol, to provide an indication as to whether the bits or symbol is correct. In some implementations, each confidence value may represent a log-likelihood ratio (LLR) corresponding to one or more bits of a received codeword.

In low-density parity-check (LDPC) applications, a binary LLR may include the logarithm of a ratio between the probability of a bit being "0" or "1". A positive LLR may indicate that a signal read from the memory cell may likely be a 0-bit, and a negative LLR may indicate that the signal read from the memory cell may likely be a 1-bit. In some examples, a bit value having an assigned LLR equal to five may be more likely to be a first predetermined value (e.g., a binary "0") than a bit value having an assigned LLR equal to a second predetermined value (e.g., a binary "1"). A bit value having an assigned LLR equal to zero may be equally likely to be either predetermined value. An LLR may also be represented by a non-binary confidence vector having a group of component values.

Each confidence value of a variable node 410 is represented by an amount of stored data. For example, each confidence value may be represented by one byte of information to represent a positive or negative LLR. Accordingly, the confidence values of variable nodes 410 are stored in corresponding variable node memories 406, with each variable node memory storing one or more confidence values for one or more variable nodes. In many cases, each variable node memory 406 will store confidence values for multiple variable nodes 410. The number of confidence values stored in each variable node memory 406 may vary depending on manufacturing criteria, but in many implementations will vary based on the number and size of circulants used in the decoding algorithm.

LDPC decoding utilizes a LDPC matrix comprised of a number n of circulants C of a circulant size $C_{size}$. In some implementations, the size of a codeword is associated with $C_{size}$, according to $C_{size} \times n$. Similarly, the code rate of the codeword is associated with n, such that the code rate=(n−4)/n.

In some implementations, as the code rate varies the code lengths may remain constant (for example, at 4608 bits) due to a format requirement. For example, data storage system 100 may be configured to implement five code rates. Table A provides information for generating a parity-check matrix based on code rate. The "row weight" parameter indicates how many circulants are included in a row of a corresponding parity-check matrix, further, and column weight indicates how many rows of circulants may be included in a parity-check matrix. The "circulant size" parameter indicates the number of rows in any given circulant, and, consequently, the number of non-null values of the identity matrix comprising the circulant. Different codes may have different circulant sizes and different row weights.

TABLE A

| Code name | Length | Rate | User Payload | Circulant size | Column weight | Row weight |
|---|---|---|---|---|---|---|
| POR4 | 4608 | 0.8333 | 3840 | 192 | 4 | 24 |
| POR5 | 4608 | 0.8750 | 4032 | 144 | 4 | 32 |
| POR6 | 4608 | 0.8889 | 4096 | 128 | 4 | 36 |
| POR7 | 4608 | 0.9167 | 4224 | 96 | 4 | 48 |
| POR8 | 4608 | 0.9375 | 4320 | 72 | 4 | 64 |

According to various implementations, each variable node memory 406 may store a number of confidence values equal to $C_{size}$. For example, if decoder 180 utilizes n=74 circulants to decode a 4 k byte codeword (32 k bits) then $C_{size}$=432 (32 k/74=432). Since each bit of the codeword corresponds to a variable node 410, each variable node memory 406 stores confidence values for 432 variable nodes. If each confidence value is represented by 1 byte of information then each variable node memory 406 may store 432 bytes, or 3460 bits of information. For a 4 k byte codeword (32 k bits) using n=60 circulants, each variable node memory stores 533 bytes (32 k/60=533), or 4266 bits of information. It can be seen that as n decreases, $C_{size}$ and the amount of information stored in each variable node memory 406 increases, while the number of variable node memories utilized decreases (n=60<n=74).

The decoding process of the subject technology utilizes a tapered variable node memory layout for storing confidence values generated by decoder 180 (e.g., using a min-sum decoding technique). In this regard, the variable node memories 406 each have a predetermined memory capacity, with the capacity of the memories decreasing in a predetermined pattern (see, e.g., FIG. 7). The number of the variable node memories 406 is fixed at the largest number n of circulants C that is expected to be utilized in decoding operations. The number n of circulants utilized varies based on the code rate and/or code length of a codeword to be decoded. The value of n may be selected from a plurality of predetermined values. For example, if the lowest number of circulants expected is 24 and the highest number of circulants expected is 74 then the number of variable node memories 406 may be fixed at 74 (or larger).

The maximum predetermined capacity of each variable node memory 406 is set to the largest expected amount of data that will be stored in the memory, which may be based on circulant size $C_{size}$. In this regard, when a code rate is selected and the number of circulants utilized for the code rate identified, processor 402 will store confidence values for a number of variable nodes 410 equal to $C_{size}$ in each of n variable node memories 406. The allocation of variable nodes 410 among the n variable node memories 406 may be determined by controller 130 and/or processor 402 according to a predetermined mapping stored, for example, in memory unit 404.

Because $C_{size}$ becomes smaller as n increases, variable node memories 406 associated with a first side of the decoding sequence of variable nodes (e.g., near the most significant bit) will require more storage capacity than variable node memories associated with the opposite side of the decoding sequence of variable nodes (e.g., near the least significant bit). The storage capacity of each of the variable node memories 406 are predetermined and does not change, even when the code rate changes.

With regard to the variable nodes 410 depicted in FIG. 4, variable node memories 416 on the left may have a greater capacity than variable memories 418 on the right, tapering down according to a predetermined pattern. The respective capacities of memories 406 are predetermined so that, as the number of circulants utilized by the decoder increases or decreases, utilization of the memory capacity of each variable node memory is maximized. This arrangement is visually represented in the chart of FIG. 7. Accordingly, with regard to FIG. 4, each of the variable node memories 406 has a memory capacity based on a position of a respective circulant used to decode a codeword. Since the order of circulants follows the order of the variable nodes in many implementations, the memory capacity of a respective variable node memory 406 is also based on the position of its corresponding variable node relative to a first variable node 420 in a series of variable nodes 410.

During operation of decoder 180, processor 402 may be operational (e.g., by way of an instruction sequence) to determine a circulant size and a number of circulants based on a code rate. The code rate may be selected in advance to decode a codeword of the code rate using the one or more check-variable node calculations. The code rate and/or length of the codeword determine which variable node memories 406 are used in the one or more check-variable node calculations based on the determined number of circulants. The number used is proportional to the number of circulants of the code rate (see, e.g., Table A). As described previously, each variable node memory 406 may store an amount of the variable node data based on the determined circulant size (e.g., $C_{size}$ bytes). This amount may be inversely proportional to the determined number of circulants, such that as n decreases, $C_{size}$ increases.

As depicted in FIG. 4, variable node memories 406 may also be divided into a plurality of subsets of variable node memories. In the depicted example, each subset includes two variable node memories; however, a subset may include any number of variable node memories 406. For example, the number of variable node memories 406 in each subset may be three, four, five, six, or other number depending on manufacturer specification and performance requirements. Additionally or in the alternative, one or more subsets may include a different number of variable node memories than one or more other subsets. The number of subsets to be used may be determined by the number of circulants associated with the code rate.

The capacities of the variable node memories may decrease according to a predetermined pattern, but memories in a particular subset may have the same capacity. In the depicted example, the predetermined memory capacity of each of the variable node memories 416 is greater than the predetermined memory capacity of each of variable node memories 422, and the predetermined memory capacity of each of the variable node memories 422 is greater than the predetermined memory capacity of each of the variable node memories 418, and so on. Accordingly, the tapered memory capacity may also be due to the relative associations of the respective variable node memories 406 with each node in the series of variable nodes 410.

As described previously, variable nodes 410 are allocated to the variable node memories 406 based on the number n of circulants utilized. Accordingly, each subset of variable node memories 406 may be associated with a number of variable nodes equal to $C_{size}$ (the number of nodes associated with each memory) multiplied by the number of variable node memories in each subset. A first subset of variable node memories 416 may store data for a first variable node 420 and other variable nodes in a series of variable nodes 410 (the data being based on calculations using, e.g., one or more first circulants of a matrix). The predetermined memory capacity of the variable node memories 406 may then taper in capacity based on a position of their respective variable nodes relative to the first variable node 420 in the series of variable nodes 410 (and relative to the first circulants of the matrix). Accordingly, a second subset of variable node memories 422 may store less data for a variable node 424 due to the position of variable node 424 being further from first variable node 420 in the series of variable nodes 410 (the data being based on calculations using, e.g., one or more second circulants of the matrix).

The respective memory capacities of variable node memories 406 are predetermined based on the previously described pattern. Unless otherwise stated, for the purpose of this disclosure, the memory capacity of a memory is its maximum capacity for storing data (e.g., bits or bytes of information). In a virtual system, each variable node memory 416 may be independently addressable as a separate memory unit. However, each variable node memory 406 may be a fixed hardware memory device. For example, each of the variable node memories 406 may be an integrated circuit embedded together in a single integrated circuit package, for example, with processor 402 and other decoding circuitry (e.g., memory unit 404). Because the size of each embedded variable node memory 406 decreases according to the predetermined pattern, decoder 180 requires less memory for decoding operations, saving cost and power consumption associated with memory. When configured for n=74, decoder 180 may use 30% less memory and 5% less power than a conventional decoder using the same amount of circulants.

Figure 5:
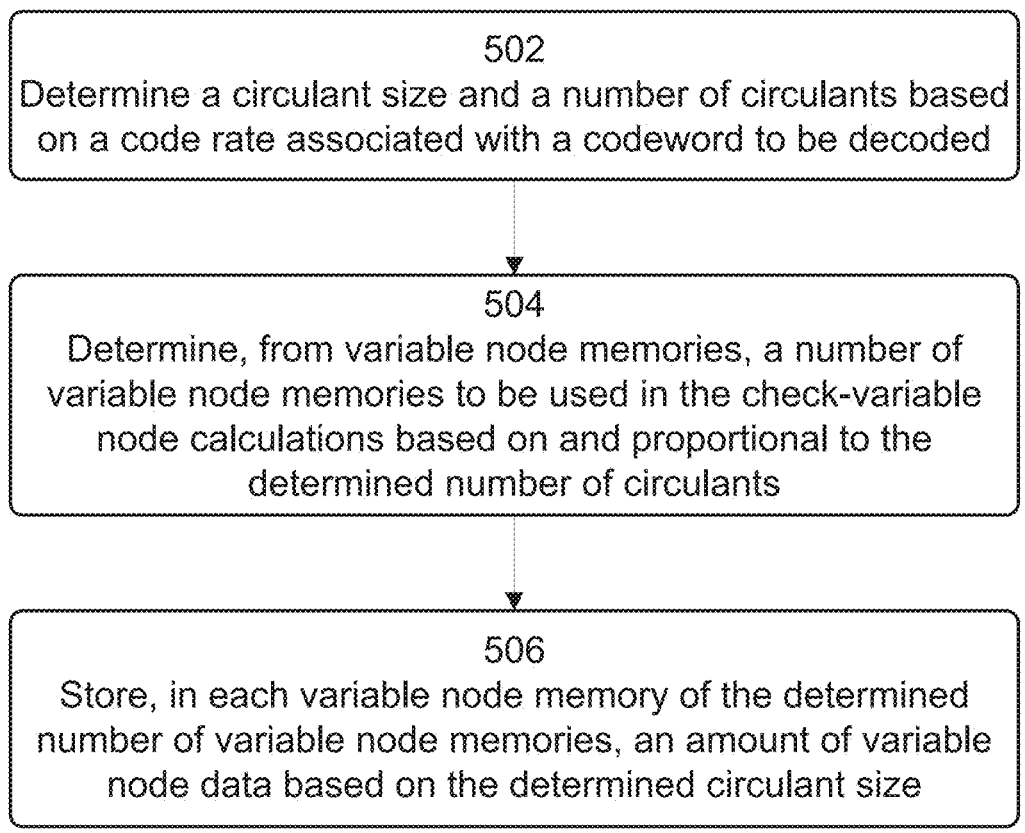
FIG. 5 depicts a flow diagram of a first example process for supporting multiple code rates according to various aspects of the subject technology.

FIG. 5 depicts a flow diagram of a first example process 500 for supporting multiple code rates according to various aspects of the subject technology. For explanatory purposes, the various blocks of example process 500 are described herein with reference to FIGS. 1-4, and the components and/or processes described herein. The one or more of the blocks of process 500 may be implemented, for example, by controller 130 and/or decoder 180, including processor 402 and other components utilized by controller 130 and/or decoder 180. In some implementations, one or more of the blocks may be implemented apart from other blocks, and by one or more different processors or controllers. Further for explanatory purposes, the blocks of example process 500 are described as occurring in serial, or linearly. However, multiple blocks of example process 500 may occur in parallel. In addition, the blocks of example process 500 need not be performed in the order shown and/or one or more of the blocks of example process 500 need not be performed.

Controller 130 and/or decoder 180 determines a circulant size and a number of circulants based on a code rate associated with a codeword to be decoded using one or more check-variable node calculations (502). The code rate may be selected from a plurality of code rates based on, for example, an internal hardware configuration (e.g., switch or firmware setting), software configuration, or dynamically based on the code rate or code length of a received codeword. The codeword is received, for example, from non-volatile memory array 150, magnetic storage 160, or a storage channel 302. Controller and/or decoder 180 execute decoding operations to decode the codeword. On receiving an indication that an existing code rate changed to a new code rate, the determined number of circulants, circulant size, and number of subsets and/or variable node memories that store variable node data may be changed.

The system then determines, a number n of variable node memories 406 to be used in the check-variable node calculations based on and proportional to the determined number of circulants (504). In this regard, if there are n circulants and n variable memories, the memory capacity of a variable node memory 406 at $C_i$ will be set to a capacity sufficient to store confidence values for $C_i$ (e.g., $C_{i-size}\times$ bytes) when ii is at its minimum. Similarly, each of the variable node memories 406 has a predetermined memory capacity based on a position of a respective variable node associated with the variable node memory relative to a first variable node in the series of variable nodes 410.

During decoding operations, processor 402 stores, in each variable node memory 406 of the determined number in of variable node memories 406, an amount of variable node data based on the determined circulant size $C_{size}$ (506). The amount of data stored in each respective variable node memory 406 may correspond to confidence values for corresponding bit positions in the codeword. In some implementations, each variable node memory stores a number of confidence values equal to $C_{size}$. Each of the confidence values may be a log-likelihood ratio, and each of the determined circulants may be a sub-matrix of a parity-check matrix, in a form of an identity matrix. According to various implementations, the amount of variable node data stored in each variable node memory is inversely proportional to n, the determined number of circulants.

Figure 6:
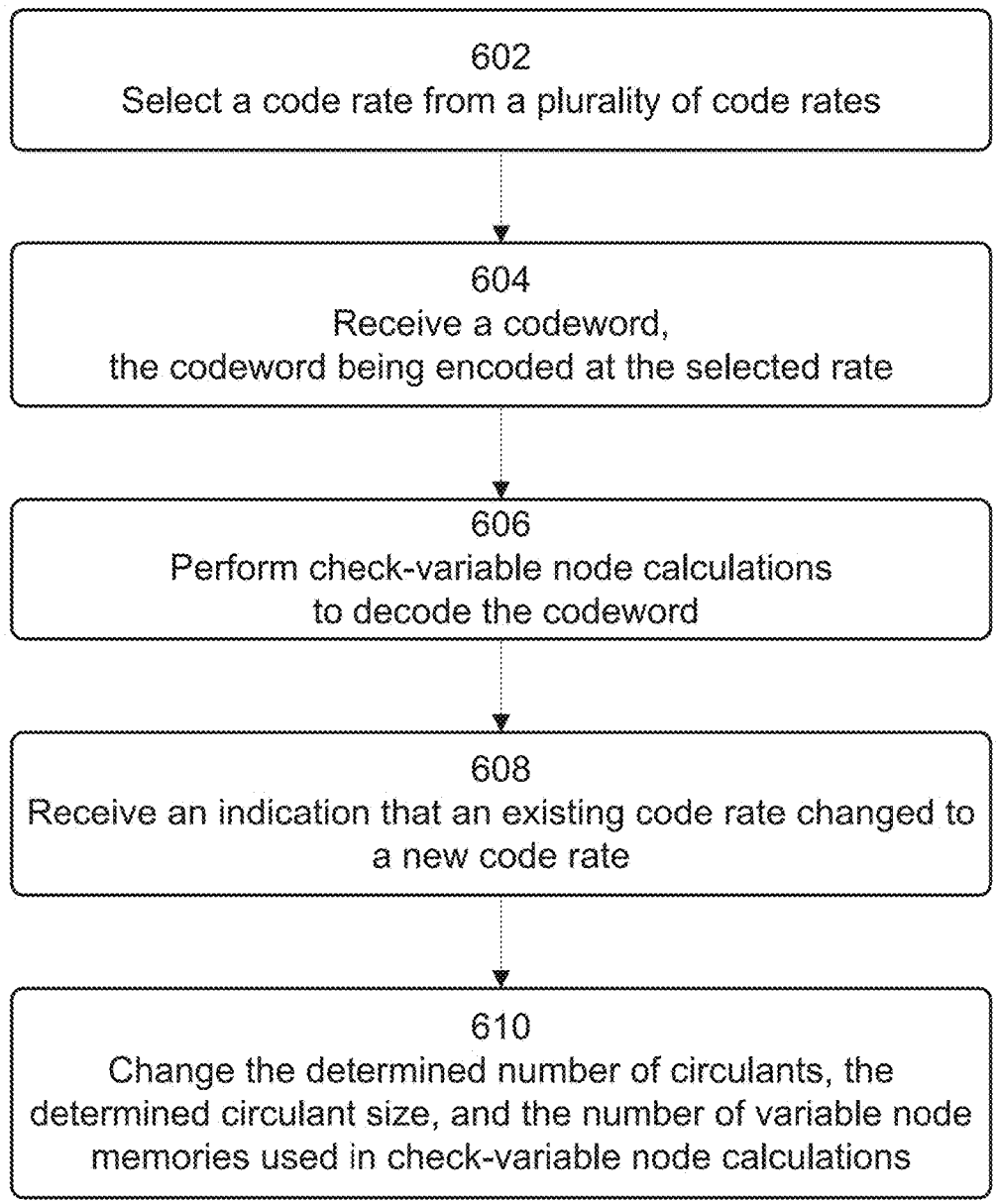
FIG. 6 depicts a flow diagram of a second example process 600 for supporting multiple code rates according to various aspects of the subject technology.

FIG. 6 depicts a flow diagram of a second example process 600 for supporting multiple code rates according to various aspects of the subject technology. For explanatory purposes, the various blocks of example process 500 are described herein with reference to FIGS. 1-4, and the components and/or processes described herein. The one or more of the blocks of process 500 may be implemented, for example, by controller 130 and/or decoder 180, including processor 402 and other components utilized by controller 130 and/or decoder 180. In some implementations, one or more of the blocks may be implemented apart from other blocks, and by one or more different processors or controllers. Further for explanatory purposes, the blocks of example process 500 are described as occurring in serial, or linearly. However, multiple blocks of example process 500 may occur in parallel. In addition, the blocks of example process 500 need not be performed in the order shown and/or one or more of the blocks of example process 500 need not be performed.

In the depicted example, the system according to the subject technology selects a code rate from a plurality of code rates (602). A codeword encoded at the code rate is received (604). Decoder 180 performs check-variable node calculations to decode the codeword (606). During operation of data storage system 100, an indication that an existing code rate used in the check-variable node calculations changed to a new code rate is received (608). In response to receiving the indication, the determined number of circulants, the determined circulant size, and the number of the variable node memories based on the new code rate are changed (610).

According to various implementations of the subject technology, if the new code rate is a first code rate (e.g., 0.9375), processor 402 sets the number of the variable node memories 406 to a first predetermined number based on the first code rate (e.g., equal to the number of circulants used in the first code rate), and stores a first amount of variable node data in each of the first predetermined number of the variable node memories 406. If the new code rate is a second code rate (e.g., 0.8750), the number of the variable node memories 406 is set to a second predetermined number based on the second code rate and a second amount of variable node data is stored in each of the second predetermined number of the variable node memories. As explained previously, the second amount of variable node data is greater than the first amount (e.g., due to increase in $C_{size}$), but less circulants are used, and thus a first subset of the first predetermined number of the variable node memories goes unused.

If the new code rate is a third code rate (e.g., 0.8333), the number of the variable node memories is set to a third predetermined number based on the third code rate and a third amount of variable node data is stored in each of the third predetermined number of the variable node memories. The third amount is greater than the second amount, and the first subset and a second subset of the second predetermined number of the variable node memories go unused for the third code rate.

The above steps of processes 500 and 600 may be performed by controller 130, decoder 180 and/or processor 402. Many of the above-described features of example processes 600 and 700 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

Figure 7:
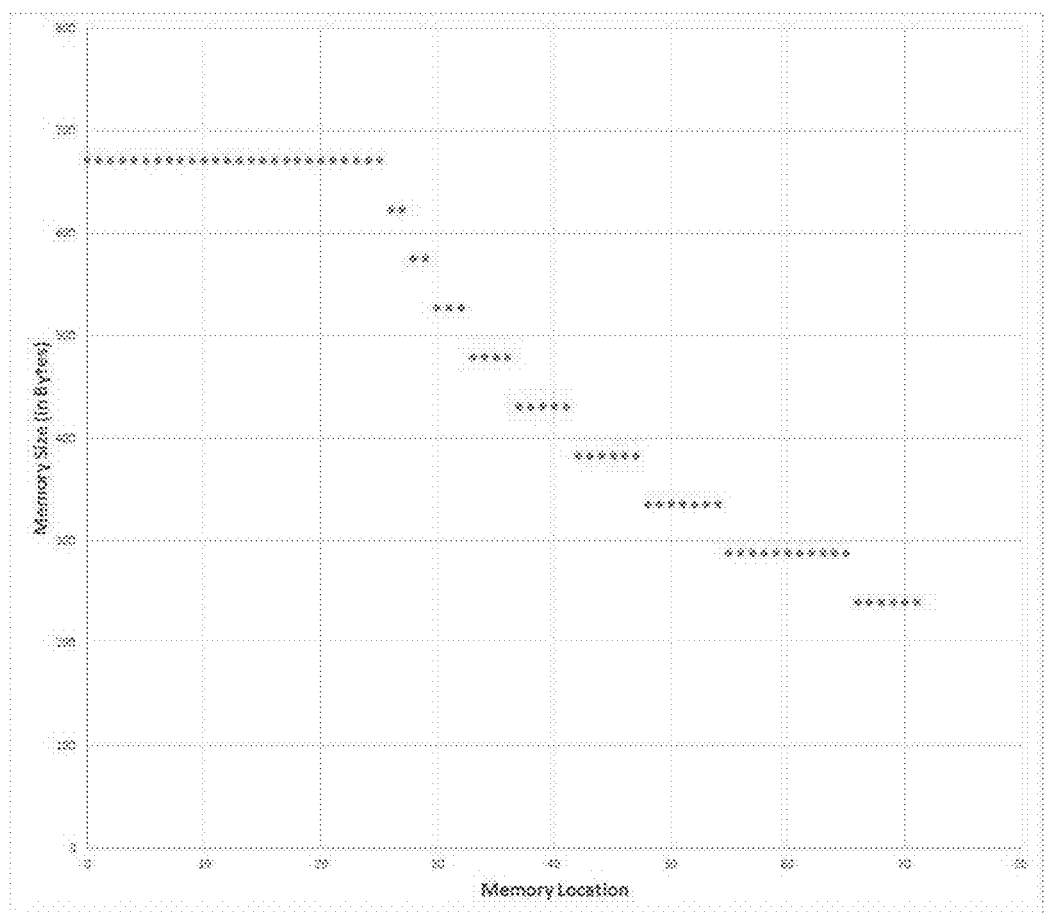
FIG. 7 depicts a chart of example memory capacities of variable node memories that support multiple code rates according to various aspects of the subject technology.

FIG. 7 depicts a chart of example memory capacities of variable node memories that support multiple code rates according to various aspects of the subject technology. FIG. 6 depicts an example relationship between memory location—e.g., the location of each variable node memory 406 as it relates to a circulant of a selected code rate—and the memory size (in bytes) of the variable node memory at the location. In the depicted example, memory location 0 corresponds to a first circulant used for decoding a first portion of a codeword. Memory location 0 may, for example, store confidence data for first variable node 420 and other variable nodes associated with the first circulant. Memory location 73 is only used when there are 74 circulants. In the depicted example, the maximum capacities of the variable node memories begin to decrease for variable node memories associated with the 26$^{th}$ circulant in a series of circulants, and continue to decrease according to the variable node location. As described previously, the memory size (capacity) is proportional to the circulant size $C_{size}$.

Accordingly, the subject technology provides a solution that may be able to accommodate multiple LDPC codes with different code rates (for example, 0.8333~0.9375) with a complexity comparable to a decoder implementation that accommodates only a single LDPC code. The subject technology also utilizes a reduced memory footprint, thus saving cost and power consumption of the decoder circuitry. The subject technology may be intended to be used in products using different flash chips with different raw error rates. This way, an ASIC used to implement the controller, encoder, and decoder aspects can be lot more versatile than single LDPC code implementations.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

Nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A decoder, comprising:
   a plurality of variable node memories, each of the variable node memories having a predetermined memory capacity based on a position of a respective variable node associated with the variable node memory relative to a first variable node in a series of variable nodes;
   a message buffer for storing messages used to update variable node data stored in the plurality of variable node memories based on check-variable node calculations; and
   a processor operational to:
      dynamically determine a circulant size and a number of circulants based on a code rate associated with a codeword to be decoded using the check-variable node calculations, wherein the determined circulant size is from a predetermined plurality of different circulant sizes, and the determined number of circulants is from a predetermined plurality of different numbers of circulants for decoding codewords;

determine a number of the variable node memories to be used in the check-variable node calculations based on and proportional to the determined number of circulants; and store, in each variable node memory of the number of the variable node memories, an amount of the variable node data based on the determined circulant size;

select a particular code rate from a plurality of code rates;

receive a codeword, the received codeword being encoded at the selected particular code rate; and perform the check-variable node calculations to decode the encoded codeword, wherein the amount of the variable node data stored in each variable node memory decreases as the determined number of circulants increases in number, and increases as the determined number of circulants decrease in number, the plurality of variable node memories is divided into a plurality of subsets of variable node memories, and the variable node memories of each subset following a first subset of the plurality of subsets have lower memory capacities than the variable node memories of each prior subset.

2. The decoder of claim 1, wherein the determined number of circulants is selected from a plurality of predetermined numbers.

3. The decoder of claim 2, wherein a first subset of the subsets, associated with a variable node further from the first variable node than a variable node associated with a second subset of the subsets, comprises variable node memories having a lower memory capacity than the variable node memories in the second subset.

4. The decoder of claim 3, wherein the processor is further operational to:

receiving an indication that an existing code rate used in the check-variable node calculations changed to a new code rate of the plurality of code rates; and in response to receiving the indication, changing the determined number of circulants, the determined circulant size, and the number of the variable node memories based on the new code rate.

5. The decoder of claim 3, wherein the plurality of variable node memories comprise:

a first subset of variable node memories with each variable node memory in the first subset having a first capacity;

a second subset of variable node memories with each variable node memory in the second subset having a first second capacity less than the first capacity; and a third subset of variable node memories with each variable node memory in the third subset having a first second capacity less than the second capacity.

6. The decoder of claim 5, wherein the processor is further operational to:

on the code rate being a first code rate, setting the number of the variable node memories to a first predetermined number based on the first code rate and storing a first amount of variable node data in each of the first predetermined number of the variable node memories;

on the code rate being a second code rate, setting the number of the variable node memories to a second predetermined number based on the second code rate and storing a second amount of variable node data in each of the second predetermined number of the variable node memories, wherein the second amount is greater than the first amount and a first subset of the first predetermined number of the variable node memories is unused for the second code rate; and on the code rate being a third code rate, setting the number of the variable node memories to a third predetermined number based on the third code rate and storing a third amount of variable node data in each of the third predetermined number of the variable node memories, wherein the third amount is greater than the second amount, and the first subset and a second subset of the second predetermined number of the variable node memories are unused for the third code rate.

7. The decoder of claim 3, wherein each of the variable node memories is embedded with a processor and other decoding circuitry in an integrated circuit package.

8. The decoder of claim 1, wherein the amount of data stored in each respective variable node memory corresponds to a confidence value for a bit position in the codeword.

9. The decoder of claim 8, wherein each of the confidence value is a log-likelihood ratio, and wherein each of the determined circulants is a sub-matrix of a parity-check matrix and is in a form of an identity matrix.

10. A non-transitory machine-implemented method, comprising:

dynamically determining a circulant size and a number of circulants based on a code rate associated with a codeword to be decoded using check-variable node calculations, wherein the determined circulant size is from a predetermined plurality of different circulant sizes, and the determined number of circulants is from a predetermined plurality of different numbers of circulants for decoding codewords;

determining, from a plurality of variable node memories, a number of the variable node memories to be used in the check-variable node calculations based on and proportional to the determined number of circulants, each of the variable node memories having a predetermined memory capacity based on a position of a respective variable node associated with the variable node memory relative to a first variable node in a series of variable nodes;

storing, in each variable node memory of the number of the variable node memories, an amount of variable node data based on the determined circulant size;

selecting a particular code rate from a plurality of code rates;

receiving a codeword, the received codeword being encoded at the particular code rate; and perform the check-variable node calculations to decode the encoded codeword, wherein the amount of the variable node data stored in each variable node memory decreases as the determined number of circulants increases in number, and increases as the determined number of circulants decrease in number, the plurality of variable node memories is divided into a plurality of subsets of variable node memories, and the variable node memories of each subset following a first subset of the plurality of subsets have lower memory capacities than the variable node memories of each prior subset.

11. The non-transitory machine-implemented method of claim 10, wherein the determined number of circulants is selected from a plurality of predetermined numbers.

12. The non-transitory machine-implemented method of claim 10, further comprising:

receiving an indication that an existing code rate used in the check-variable node calculations changed to a new code rate of the plurality of code rates; and in response to receiving the indication, changing the determined number of circulants, the determined circulant size, and the number of the variable node memories based on the new code rate.

13. The non-transitory machine-implemented method of claim 12, further comprising:

on the new code rate being a first code rate, setting the number of the variable node memories to a first predetermined number based on the first code rate and storing a first amount of variable node data in each of the first predetermined number of the variable node memories;

on the new code rate being a second code rate, setting the number of the variable node memories to a second predetermined number based on the second code rate and storing a second amount of variable node data in each of the second predetermined number of the variable node memories, wherein the second amount is greater than the first amount and a first subset of the first predetermined number of the variable node memories is unused for the second code rate; and on the new code rate being a third code rate, setting the number of the variable node memories to a third predetermined number based on the third code rate and storing a third amount of variable node data in each of the third predetermined number of the variable node memories, wherein the third amount is greater than the second amount, and the first subset and a second subset of the second predetermined number of the variable node memories are unused for the third code rate.

14. The non-transitory machine-implemented method of claim 10, wherein each of the variable node memories is a fixed hardware memory device.

15. A data storage system, comprising:

means for dynamically determining a circulant size and a number of circulants based on a code rate associated with a codeword to be decoded using check-variable node calculations, wherein the determined circulant size is from a predetermined plurality of different circulant sizes, and the determined number of circulants is from a predetermined plurality of different numbers of circulants for decoding codewords;

means for providing a plurality of variable node memories, with each of the variable node memories having a predetermined memory capacity based on a position of a respective variable node associated with the variable node memory relative to a first variable node in a series of variable nodes;

means for determining, from the plurality of variable node memories, a number of the variable node memories to be used in the check-variable node calculations based on and proportional to the determined number of circulants;

means for storing, in each variable node memory of the number of the variable node memories, an amount of variable node data based on the determined circulant size;

means for selecting a particular code rate from a plurality of code rates;

means for receiving a codeword, the received codeword being encoded at the particular code rate; and means for performing the check-variable node calculations to decode the encoded codeword, wherein the amount of the variable node data stored in each variable node memory decreases as the determined number of circulants increases in number, and increases as the determined number of circulants decrease in number, the plurality of variable node memories is divided into a plurality of subsets of variable node memories, and the variable node memories of each subset following a first subset of the plurality of subsets have lower memory capacities than the variable node memories of each prior subset.

16. The data storage system of claim 15, wherein the determined number of circulants is selected from a plurality of predetermined numbers.

17. The data storage system of claim 16, further comprising:

a first subset of variable node memories with each variable node memory in the first subset having a first capacity;

a second subset of variable node memories with each variable node memory in the second subset having a first second capacity less than the first capacity; and a third subset of variable node memories with each variable node memory in the third subset having a first second capacity less than the second capacity.

18. The data storage system of claim 15, further comprising:

means for receiving an indication that an existing code rate used in the check-variable node calculations changed to a new code rate of the plurality of code rates; and means for, in response to receiving the indication, changing the determined number of circulants, the determined circulant size, and the number of the variable node memories based on the new code rate.

19. The data storage system of claim 18, further comprising:

means for, on the new code rate being a first code rate, setting the number of the variable node memories to a first predetermined number based on the first code rate and storing a first amount of variable node data in each of the first predetermined number of the variable node memories;

means for, on the new code rate being a second code rate, setting the number of the variable node memories to a second predetermined number based on the second code rate and storing a second amount of variable node data in each of the second predetermined number of the variable node memories, wherein the second amount is greater than the first amount and a first subset of the first predetermined number of the variable node memories is unused for the second code rate; and means for, on the new code rate being a third code rate, setting the number of the variable node memories to a third predetermined number based on the third code rate and storing a third amount of variable node data in each of the third predetermined number of the variable node memories, wherein the third amount is greater than the second amount, and the first subset and a second subset of the second predetermined number of the variable node memories are unused for the third code rate.

20. The data storage system of claim 15, wherein each of the variable node memories is embedded with a processor and other decoding circuitry in an integrated circuit package.

21. The data storage system of claim 15, wherein the amount of data stored in each respective variable node memory corresponds to a confidence value for a bit position in the codeword.

22. The data storage system of claim 21, wherein each of the confidence value is a log-likelihood ratio, and wherein each of the determined circulants is a sub-matrix of a parity-check matrix and is in a form of an identity matrix.

* * * * *